United States Patent
Books et al.

(10) Patent No.: US 10,996,277 B2
(45) Date of Patent: May 4, 2021

(54) SYSTEM AND METHODS FOR ACCOMMODATING LOSS OF BATTERY CHARGE HISTORY

(71) Applicant: Cummins Inc., Columbus, IN (US)

(72) Inventors: Martin T. Books, Columbus, IN (US); Carl A. Jones, Columbus, IN (US)

(73) Assignee: Cummins Inc., Columbus, IN (US)

( * ) Notice: Subject to any disclaimer, the term of this patent is extended or adjusted under 35 U.S.C. 154(b) by 116 days.

(21) Appl. No.: 16/335,469

(22) PCT Filed: Sep. 29, 2016

(86) PCT No.: PCT/US2016/054479
§ 371 (c)(1),
(2) Date: Mar. 21, 2019

(87) PCT Pub. No.: WO2018/063251
PCT Pub. Date: Apr. 5, 2018

(65) Prior Publication Data
US 2019/0227126 A1    Jul. 25, 2019

(51) Int. Cl.
*G01R 31/364* (2019.01)
*G01R 31/36* (2020.01)
(Continued)

(52) U.S. Cl.
CPC ...... *G01R 31/3647* (2019.01); *F02N 11/0825* (2013.01); *G01R 31/36* (2013.01);
(Continued)

(58) Field of Classification Search
CPC ...... G01N 27/20; G01N 27/041; G01N 17/04; G01M 5/0083; G01M 5/0016
(Continued)

(56) References Cited

U.S. PATENT DOCUMENTS 7,977,957 B2 * 7/2011 Bohm ............... G01R 31/2808
324/750.23
8,098,077 B2 * 1/2012 Schmid ............ G01R 1/07357
324/754.11
(Continued)

OTHER PUBLICATIONS

International Search Report and Written Opinion for International Application No. PCT/US2016/054479, dated Dec. 9, 2016, 10 pages.

*Primary Examiner* — Giovanni Astacio-Oquendo
(74) *Attorney, Agent, or Firm* — Foley & Lardner LLP

(57) ABSTRACT

A method includes receiving a first confidence level from a first battery sensor coupled to a first battery electrically coupled to an engine; receiving a second confidence level from a second battery sensor coupled to a second battery electrically coupled to the engine; storing the first confidence level and the second confidence level prior to the engine being powered off; receiving an updated first confidence level and an updated second confidence level after the engine is powered on; comparing (i) the first confidence level to the updated first confidence level for the first battery sensor and (ii) the second confidence level to the updated second confidence level for the second battery sensor; and enabling a stop-start functionality of the engine in response to the first confidence level and the second confidence level decreasing after the engine system is powered on relative to when the engine system was powered off.

20 Claims, 6 Drawing Sheets

(51) Int. Cl.
*G01R 31/382* (2019.01)
*G01R 31/392* (2019.01)
*F02N 11/08* (2006.01)
*H01M 10/42* (2006.01)

(52) U.S. Cl.
CPC ....... *G01R 31/3648* (2013.01); *G01R 31/382* (2019.01); *G01R 31/392* (2019.01); *H01M 10/425* (2013.01)

(58) Field of Classification Search
USPC .......................... 324/693, 691, 649, 600, 433
See application file for complete search history.

(56) References Cited

U.S. PATENT DOCUMENTS

| | | | |
|---|---|---|---|
| 8,217,675 B2* | 7/2012 | Boehm | G01R 1/07378 |
| | | | 324/756.03 |
| 8,525,519 B2 | 9/2013 | Johnson et al. | |
| 2010/0321025 A1 | 12/2010 | Lin et al. | |
| 2011/0095093 A1 | 4/2011 | Wohrle | |
| 2014/0025243 A1 | 1/2014 | Hose et al. | |
| 2014/0081561 A1 | 3/2014 | Be et al. | |
| 2014/0103933 A1 | 4/2014 | Gibbs | |
| 2014/0207318 A1 | 7/2014 | Sisk et al. | |
| 2014/0257608 A1 | 9/2014 | Dufford | |
| 2015/0151740 A1 | 6/2015 | Hynes et al. | |
| 2019/0171875 A1* | 6/2019 | Northrup | G06K 9/00456 |
| 2019/0296993 A1* | 9/2019 | Subramoni | H04L 41/142 |
| 2019/0354680 A1* | 11/2019 | De Lima Junior | G06F 21/552 |

* cited by examiner

SYSTEM AND METHODS FOR ACCOMMODATING LOSS OF BATTERY CHARGE HISTORY

TECHNICAL FIELD

The present application relates generally to the field of engine stop-start. More particularly, the present application relates to systems and methods for managing engine stop-start in applications where battery charge history may be lost.

BACKGROUND

Battery sensors are often used in electric, hybrid, and internal combustion engine vehicles. Battery sensors are positioned within a vehicle to monitor operating characteristics of one or more batteries of the vehicle. In mild hybrid and internal combustion engine vehicles, data from the battery sensors may be used to make stop-start decisions. However, battery sensors in such applications traditionally have volatile memory such that a disconnect from a power source (e.g., the battery) will erase the memory of the battery sensor and any data stored thereon relating to the operating characteristics of the battery. Such a loss of data may cause a stop-start functionality of the vehicle to be disabled until the battery sensor regains confidence, thereby decreasing fuel efficiency and altering the normal operation of the vehicle until the confidence is restored.

SUMMARY

One embodiment relates to a method. The method includes receiving, by a processing circuit, a first confidence level from a first battery sensor coupled to a first battery electrically coupled to an engine system; receiving, by the processing circuit, a second confidence level from a second battery sensor coupled to a second battery electrically coupled to the engine system; storing, by the processing circuit in a memory, the first confidence level and the second confidence level prior to the engine system being powered off; receiving, by the processing circuit, an updated first confidence level from the first battery sensor and an updated second confidence level from the second battery sensor after the engine system is powered on; comparing, by the processing circuit, (i) the first confidence level to the updated first confidence level for the first battery sensor and (ii) the second confidence level to the updated second confidence level for the second battery sensor; and enabling, by the processing circuit, a stop-start functionality of the engine system in response to the first confidence level and the second confidence level decreasing after the engine system is powered on relative to when the engine system was powered off.

Another embodiment relates to a method. The method includes monitoring, by a processing circuit, an internal clock of the processing circuit each time an engine is started; receiving, by the processing circuit from a battery sensor coupled to a battery, battery data indicative of operating characteristics of the battery and a confidence level for the operating characteristics; and enabling, by the processing circuit, a stop-start functionality of the engine in response to detecting the internal clock being reset and the confidence level being less than a threshold confidence level.

Another embodiment relates to a method. The method includes receiving, by a processing circuit from a battery sensor coupled to a battery of an engine, battery data indicative of operating characteristics of the battery and a confidence level for the operating characteristics; comparing, by the processing circuit, the confidence level to a threshold confidence level; and at least one of (i) performing, by the processing circuit, a stop-start sequence that turns the engine on and off until the confidence level of the battery sensor exceeds the threshold confidence level and (ii) providing, by the processing circuit via a user interface, a notification to an operator of the engine to manually perform the stop-start sequence by manually turning the engine on and off until the confidence level of the battery sensor exceeds the threshold confidence level in response to the confidence level being less than the threshold confidence level.

These and other features, together with the organization and manner of operation thereof, will become apparent from the following detailed description when taken in conjunction with the accompanying drawings.

DETAILED DESCRIPTION

Figure 1:
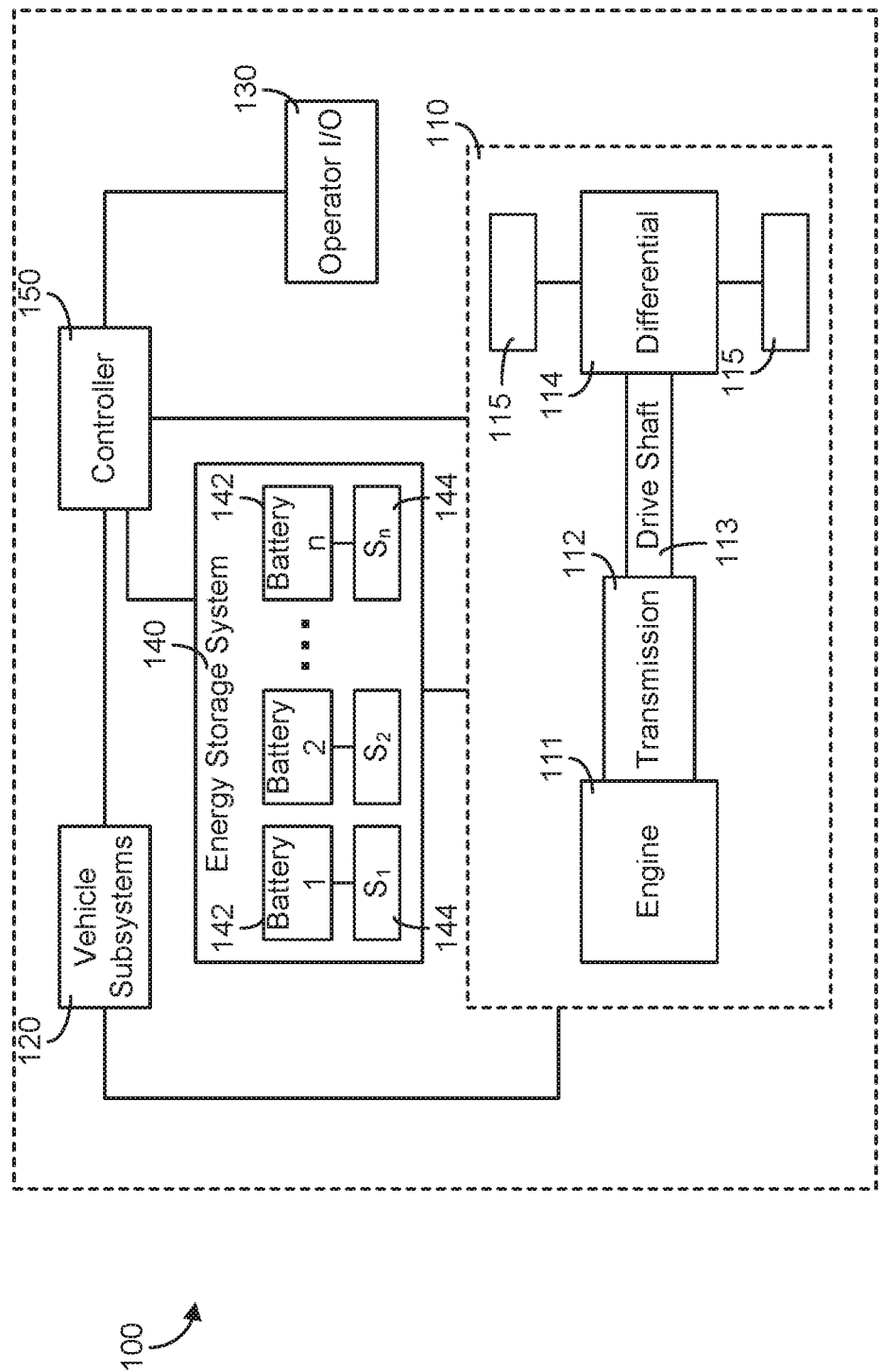
FIG. 1 is a schematic diagram of a vehicle with a controller, according to an example embodiment.

Following below are more detailed descriptions of various concepts related to, and implementations of, methods, apparatuses, and systems for accommodating loss of battery charge history in engine stop-start systems. The various concepts introduced above and discussed in greater detail below may be implemented in any number of ways, as the concepts described are not limited to any particular manner of implementation. Examples of specific implementations and applications are provided primarily for illustrative purposes.

Referring to the Figures generally, the various embodiments disclosed herein relate to systems, apparatuses, and methods for accommodating loss of battery charge history in engine stop-start systems. In the field of vehicle electrification, many functions that were previously performed mechanically via belt drives (e.g. power steering pumps, air conditioning, etc.) are now being done electrically. Furthermore, hybrid-electric vehicles are bringing electrically generated torque to the vehicle drivetrain. All these advances are driving technological advancement into the vehicle battery system. Large powerful batteries are becoming some of the most expensive components in the vehicle and come complete with a sophisticated Battery Management System (BMS). However, there are also low cost versions of these applications where aggressive capabilities and fuel savings are foregone in the name of utilizing inexpensive batteries. These include mild hybrids and stop/start systems. Such systems still need to know the current state of charge (SOC) of the battery, but do not include the complex BMS of, say, a high power Lithium-Ion battery. This has triggered the development of stand-alone battery sensors which monitor battery operation (e.g., voltage, current, temperature, etc.) and estimate battery parameters such as SOC, state of health (SOH), and state of function (SOF).

The estimated battery parameter may not be accurately determined via single instantaneous data samples. Rather, they may require a rather lengthy data trending process to "learn" where the battery is on the spectrum of fully charged to fully discharged. The time required to converge on a value may depend on the level of activity of the battery. The more the battery is used, the faster the convergence may occur. The convergence time may range from as low as thirty minutes under heavy battery usage to more than ten hours for relatively little battery usage. During the process, the battery sensors frequently broadcast a "confidence parameter" or "confidence level" indicating the convergence status of the estimated battery parameters.

To keep the cost of the battery sensors down, the battery sensors may not include non-volatile memory since the battery sensors are usually directly coupled to a battery and are not typically powered off. However, the implication of battery sensors having volatile memory is that the battery sensors are incapable of "remembering" learned parameters across an actual battery disconnect. If the battery sensors are ever disconnected from the battery, all trended data stored in volatile memory is lost, and the battery must re-learn SOC, SOH, etc. on a subsequent reconnection. Problems arise when engine service procedures dictate total disconnection of the batteries (e.g., for safety purposes, etc.) during a service event. In these situations, the reconnected battery sensors have to repeat the trending/learning process, and therefore any control functionality that relies on the batteries' calculated SOC, SOH, etc. must cope with low data confidence for some period of time, usually by disabling affected functionality. For example, engine stop-start functionality may be disabled immediately following a service event in which the batteries are disconnected, and may possibly be disabled for up to ten hours while the battery sensors re-converge on battery operating estimations (e.g., SOC, SOH, etc.). Disabling the stop-start functionality may have a direct fuel economy impact and cause customer complaints.

Referring now to FIG. 1, a schematic diagram of a vehicle 100 with a controller 150 is shown according to an example embodiment. As shown in FIG. 1, the vehicle 100 generally includes a powertrain system 110, vehicle subsystems 120, an operator input/output (I/O) device 130, an energy storage system 140, and a controller 150. These components are described more fully herein. The vehicle 100 may be an on-road or an off-road vehicle including, but not limited to, line-haul trucks, mid-range trucks (e.g., pick-up truck), cars (e.g., sedans, hatchbacks, coupes, etc.), buses, vans, refuse vehicles, delivery trucks, and any other type of vehicle which may include a stop-start feature or functionality. According to an example embodiment, the powertrain system 110 of the vehicle 100 is structured as a traditional combustion engine powertrain system having a stop-start functionality. In other embodiments, the powertrain system 110 of the vehicle 100 is structured as a hybrid powertrain system (e.g., the powertrain system 110 includes one or more motors and/or generators, etc.).

Components of the vehicle 100 may communicate with each other or foreign components using any type and any number of wired or wireless connections. For example, a wired connection may include a serial cable, a fiber optic cable, a CAT5 cable, or any other form of wired connection. Wireless connections may include the Internet, Wi-Fi, cellular, radio, Bluetooth, ZigBee, etc. In one embodiment, a controller area network (CAN) bus provides the exchange of signals, information, and/or data. The CAN bus includes any number of wired and wireless connections. Because the controller 150 is communicably coupled to the systems and components in the vehicle 100 of FIG. 1, the controller 150 is structured to receive data regarding one or more of the components shown in FIG. 1. For example, the data may include operation data regarding the operating conditions of the energy storage system 140 and/or other components (e.g., batteries, an engine, etc.) acquired by one or more sensors. As another example, the data may include an input from operator I/O device 130. The controller 150 may determine when it is permissible to enable the stop-start feature based on the operation data and operating parameters.

As shown in FIG. 1, the powertrain system 110 includes an engine 111, a transmission 112, a drive shaft 113, a differential 114, a final drive 115. The engine 111 may be structured as any engine type, including a spark-ignition internal combustion engine, a compression-ignition internal combustion engine, and/or a fuel cell, among other alternatives. The engine 111 may be powered by any fuel type (e.g., diesel, ethanol, gasoline, natural gas, propane, hydrogen, electricity, etc.). Similarly, the transmission 112 may be structured as any type of transmission, such as a continuous variable transmission, a manual transmission, an automatic transmission, an automatic-manual transmission, a dual clutch transmission, and so on.

Accordingly, as transmissions vary from geared to continuous configurations (e.g., continuous variable transmission), the transmission may include a variety of settings (gears, for a geared transmission) that affect different output speeds based on an input speed received thereby (e.g., from the engine 111, etc.). Like the engine 111 and the transmission 112, the drive shaft 113, differential 114, and final drive 115 may be structured in any configuration dependent on the application (e.g., the final drive 115 is structured as wheels in an automotive application and a propeller in a boat application, etc.). Further, the drive shaft 113 may be structured as any type of drive shaft including, but not limited to, a one-piece, two-piece, and a slip-in-tube driveshaft based on the application.

According to an example embodiment, the engine 111 receives a chemical energy input (e.g., a fuel such as gasoline, diesel, etc.) and combusts the fuel to generate mechanical energy, in the form of a rotating crankshaft. The transmission 112 receives the rotating crankshaft and manipulates the speed of the crankshaft (e.g., the engine revolutions-per-minute (RPM), etc.) to affect a desired drive shaft speed. The rotating drive shaft 113 is received by the differential 114, which provides the rotation energy of the drive shaft 113 to the final drive 115. The final drive 115 then propels or moves the vehicle 100.

As shown in FIG. 1, the energy storage system 140 includes a plurality of batteries, shown as batteries 142, and a plurality of sensors, shown as battery sensors 144. According to an example embodiment, the vehicle 100 includes two or more batteries 142 (e.g., two, three, four, five, etc.). In some embodiments, the vehicle 100 includes a single battery 142. The batteries 142 may include lead-acid batteries and/or another type of battery or storage device typically used in a combustion engine and/or mild hybrid vehicle. According to an example embodiment, the vehicle 100 includes a corresponding number of battery sensors 144 such that each battery 142 has an associated battery sensor 144.

According to an example embodiment, the batteries 142 are electrically coupled to the engine 111 and structured to provide electrical energy (e.g., current, etc.) thereto to facilitate starting the engine 111 (e.g., in response to an operator providing a start command via a key or a start button, according to a stop-start feature/functionality, etc.). According to an example embodiment, each of the battery sensors 144 is coupled to a respective battery 142 (e.g., to a battery post/terminal thereof, etc.). The battery sensors 144 may be structured and/or positioned to acquire battery data from the batteries 142. The battery data may be indicative of operating characteristics of the batteries 142. The operating characteristics of the batteries 142 may include SOC, SOH, SOF, current flow into and/or out of the batteries 142, voltage, and/or temperature. The battery sensors 144 may additionally determine and broadcast a confidence level associated with the operating characteristics. The confidence level may indicate an estimated accuracy or reliability of the battery data associated with the batteries 142.

According to an example embodiment, the battery sensors 144 have volatile memory such that disconnecting a battery sensor 144 from its respective battery 142 (e.g., for maintenance purposes, etc.) effectively erases (e.g., clears, deletes, etc.) any memory (e.g., information, data, battery charge history, etc.) regarding the battery data and the confidence level. Disconnecting the battery sensor 144 from the battery 142 may thereby erase the volatile memory of the battery sensor 144 causing the confidence level to drop (e.g., decrease, reset, etc.) below a threshold confidence level such that the battery sensor 144 subsequently provides the battery data with a low confidence or the battery data includes a confidence level that is low.

Referring still to FIG. 1, the vehicle 100 includes the vehicle subsystems 120. The vehicle subsystems 120 may include mechanically driven and/or electrically driven vehicle components (e.g., HVAC system, lights, pumps, fans, etc.). The vehicle subsystems 120 may also include any component used to reduce exhaust emissions, such as selective catalytic reduction (SCR) catalyst, a diesel oxidation catalyst (DOC), a diesel particulate filter (DPF), a diesel exhaust fluid (DEF) doser with a supply of diesel exhaust fluid, a plurality of sensors for monitoring the aftertreatment system (e.g., a nitrogen oxide (NOx) sensor, temperature sensors, etc.), and/or still other components.

The operator I/O device 130 may enable an operator of the vehicle 100 (or passenger) to communicate with the vehicle 100 and the controller 150. By way of example, the operator I/O device 130 may include, but is not limited to, an interactive display, a touchscreen device, one or more buttons and switches, voice command receivers, and the like. In one embodiment, the operator I/O device 130 includes a brake and an accelerator pedal. The vehicle 100 may include additional sensors positioned and/or structured to monitor operating characteristics of various components of the vehicle 100 (e.g., the engine 111, an exhaust aftertreatment system, etc.).

As the components of FIG. 1 are shown to be embodied in the vehicle 100, the controller 150 may be structured as an electronic control module (ECM). The ECM may include a transmission control unit and any other vehicle control unit (e.g., exhaust aftertreatment control unit, powertrain control module, engine control module, etc.). The function and structure of the controller 150 is described in greater detail in FIG. 2.

Figure 2:
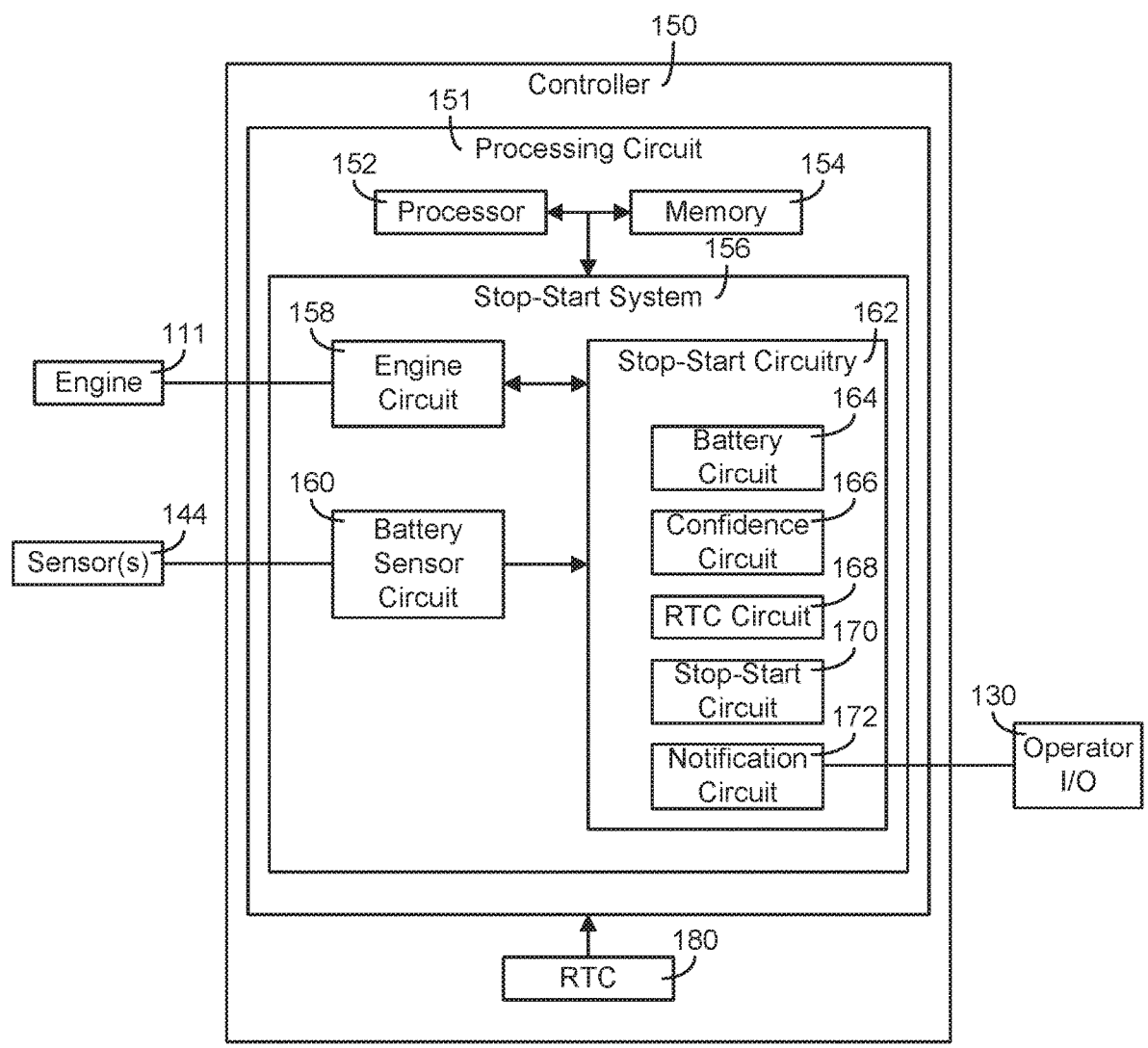
FIG. 2 is a schematic diagram of the controller of the vehicle of FIG. 1, according to an example embodiment.

Referring now to FIG. 2, a schematic diagram of the controller 150 of the vehicle 100 of FIG. 1 is shown according to an example embodiment. As shown in FIG. 2, the controller 150 includes a processing circuit 151 and an internal clock, show as real-time clock (RTC) 180. According to an example embodiment, the RTC 180 is structured to start a timer each time the engine 111 is started and stop the timer each time the engine 111 is turned off (e.g., to facilitate monitoring an engine run-time, etc.). In some embodiments, disconnecting the batteries 142 from the engine 111 causes the RTC 180 to reset (e.g., to return to zero, etc.).

As shown in FIG. 2, the processing circuit 151 includes a processor 152, a memory 154, and a stop-start system 156. The processor 152 may be implemented as a general-purpose processor, an application specific integrated circuit (ASIC), one or more field programmable gate arrays (FPGAs), a digital signal processor (DSP), a group of processing components, or other suitable electronic processing components. The memory 154 (e.g., RAM, ROM, Flash Memory, hard disk storage, non-volatile memory, etc.) may store data and/or computer code for facilitating the various processes described herein. The memory 154 may be communicably connected to the processor 152 and the stop-start system 156 and structured to provide computer code or instructions to the processor 152 for executing the processes described in regard to the stop-start system 156 herein. Moreover, the memory 154 may be or include tangible, non-transient volatile memory or non-volatile memory. Accordingly, the memory 154 may include database components, object code components, script components, or any other type of information structure for supporting the various activities and information structures described herein.

The stop-start system 156 includes various circuits for completing the activities described herein. More particularly, the stop-start system 156 includes an engine circuit 158, a battery sensor circuit 160, and stop-start circuitry 162. The circuits 158-162 are structured to accommodate loss of battery charge history in engine stop-start systems (e.g., to increase the confidence level of non-faulty battery sensors 144 after a service event in which the battery sensors 144 are disconnected from the batteries 142, etc.). While various circuits with particular functionality are shown in FIG. 2, it should be understood that the controller 150, the stop-start system 156, and/or the memory 154 may include any number of circuits for completing the functions described herein. For example, the activities and functionalities of circuits 158-162 may be embodied in the memory 154, or combined in multiple circuits or as a single circuit. Additional circuits with additional functionality may also be included. Further, it should be understood that the controller 150 may further control other activity beyond the scope of the present disclosure.

Certain operations of the controller 150 described herein may include operations to interpret and/or to determine one or more parameters. Interpreting or determining, as utilized herein, includes receiving values by any method known in the art, including at least receiving values from a datalink or network communication, receiving an electronic signal (e.g., a voltage, frequency, current, or PWM signal) indicative of the value, receiving a computer generated parameter indicative of the value, reading the value from a memory location on a non-transient computer readable storage medium, receiving the value as a run-time parameter by any means known in the art, and/or by receiving a value by which the interpreted parameter can be calculated, and/or by referencing a default value that is interpreted to be the parameter value.

The controller 150 may include wired or wireless interfaces (e.g., jacks, antennas, transmitters, receivers, transceivers, wire terminals, etc.) for conducting data communications with various systems, devices, or networks. For example, the controller 150 may include an Ethernet card and port for sending and receiving data via an Ethernet-based communications network and/or a Wi-Fi transceiver for communicating via a wireless communications network. The controller 150 may be structured to communicate via local area networks or wide area networks (e.g., the Internet, etc.) and may use a variety of communications protocols (e.g., IP, LON, Bluetooth, ZigBee, radio, cellular, near field communication, etc.).

The controller 150 may facilitate communication between and among the stop-start system 156 and components of the vehicle 100 (e.g., the powertrain system 110, the engine 111, the energy storage system 140, the battery sensors 144, the operator I/O device 130, etc.). Communication between and among the controller 150, the stop-start system 156, and the components of the vehicle 100 (e.g., the powertrain system 110, the engine 111, the energy storage system 140, the operator I/O device 130, the battery sensors 144, etc.) may be via any number of wired or wireless connections (e.g., any standard under IEEE 802, etc.). For example, a wired connection may include a serial cable, a fiber optic cable, a CAT5 cable, or any other form of wired connection. In comparison, a wireless connection may include the Internet, Wi-Fi, cellular, Bluetooth, ZigBee, radio, etc. In one embodiment, a controller area network (CAN) bus provides the exchange of signals, information, and/or data. The CAN bus can include any number of wired and wireless connections that provide the exchange of signals, information, and/or data. The CAN bus may include a local area network (LAN), or a wide area network (WAN), or the connection may be made to an external computer (for example, through the Internet using an Internet Service Provider).

The engine circuit 158 may be structured to control operation of and/or receive data regarding the operation of the engine 111. By way of example, the engine circuit 158 may be structured to facilitate selectively turning on and/or off the engine 111 (e.g., according to a stop-start strategy for the engine 111, in response to receiving a user input to start or turn off the engine 111, etc.). In some embodiments, the engine circuit 158 may include or be communicably and operatively coupled to the engine 111 to facilitate controlling operation of the engine 111.

According to one embodiment, the engine circuit 158 may include communication circuitry structured to facilitate the exchange of information, data, values, non-transient signals, etc. between and among the engine circuit 158, the engine 111, and the stop-start circuitry 162. For example, the communication circuitry may include a channel comprising any type of communication channel (e.g., fiber optics, wired, wireless, etc.), wherein the channel may include any additional component for signal enhancement, modulation, demodulation, filtering, and the like. In this regard, the engine circuit 158 may include communication circuitry including, but not limited to, wired and wireless communication protocol to facilitate reception of the data regarding operation of the engine 111.

In another embodiment, the engine circuit 158 may include machine-readable media stored by the memory 154 and executable by the processor 152, wherein the machine-readable media facilitates performance of certain operations to receive the data regarding the operation of the engine 111 and/or control operation of the engine 111. For example, the machine-readable media may provide an instruction (e.g., command, etc.) to sensors of the engine 111 to acquire engine data. In this regard, the machine-readable media may include programmable logic that defines the frequency of acquisition of the engine data. In yet another embodiment, the engine circuit 158 may include any combination of machine-readable content, communication circuitry, the engine 111, and engine sensors.

The battery sensor circuit 160 may be structured to receive and/or interpret the battery data from the battery sensors 144 of the energy storage system 140 indicative of operating characteristics of the batteries 142 and a confidence level of the battery data. As described above, the battery data may include estimated battery parameters (e.g., SOC, SOH, SOF, etc.) that may be determined by the battery sensors 144 based on battery operation (e.g., voltage, current, temperature, etc.).

According to one embodiment, the battery sensor circuit 160 may include communication circuitry structured to facilitate the exchange of information, data, values, non-transient signals, etc. between and among the battery sensor circuit 160, the battery sensors 144, and the stop-start circuitry 162. For example, the communication circuitry may include a channel comprising any type of communication channel (e.g., fiber optics, wired, wireless, etc.), wherein the channel may include any additional component for signal enhancement, modulation, demodulation, filtering, and the like. In this regard, the battery sensor circuit 160 may include communication circuitry including, but not limited to, wired and wireless communication protocol to facilitate reception of the battery data regarding operation of the batteries 142.

In another embodiment, the battery sensor circuit 160 may include machine-readable media stored by the memory 154 and executable by the processor 152, wherein the machine-readable media facilitates performance of certain operations to receive the battery data regarding the operation of the batteries 142. For example, the machine-readable media may provide an instruction (e.g., command, etc.) to the battery sensors of the energy storage system 140 to acquire the battery data. In this regard, the machine-readable media may include programmable logic that defines the frequency of acquisition of the battery data. In yet another embodiment, the battery sensor circuit 160 may include any combination of machine-readable content, communication circuitry, the batteries 142, and the battery sensors 144.

The stop-start circuitry 162 may be structured to receive the battery data from the battery sensor circuit 160 and send commands to the engine circuit 158 to enable or disable the stop-start functionality of the engine 111 based on the battery data (e.g., based the operating characteristics of the batteries 142 and the confidence level of the battery sensors 144, etc.). According to one embodiment, the stop-start circuitry 162 may include communication circuitry structured to facilitate the exchange of information, data, values, non-transient signals, etc. between and among the stop-start circuitry 162, the battery sensor circuit 160, and/or the engine circuit 158. For example, the communication circuitry may include a channel comprising any type of communication channel (e.g., fiber optics, wired, wireless, etc.), wherein the channel may include any additional component for signal enhancement, modulation, demodulation, filtering, and the like. In this regard, the stop-start circuitry 162 may include communication circuitry including, but not limited to, wired and wireless communication protocol to facilitate reception of and/or provide information to the battery sensor circuit 160 and/or the engine circuit 158.

In another embodiment, the stop-start circuitry 162 may include machine-readable media stored by the memory 154 and executable by the processor 152, wherein the machine-readable media facilitates performance of certain operations to receive the data regarding the operation and/or send commands. For example, the machine-readable media may provide an instruction (e.g., command, etc.) to the engine circuit 158 to turn on or turn off the engine 111 and/or to the operator I/O device 130 to provide a notification to the operator. In yet another embodiment, the stop-start circuitry 162 may include any combination of machine-readable content and communication circuitry.

As shown in FIG. 2, the stop-start circuitry 162 includes a battery circuit 164, a confidence circuit 166, a RTC circuit 168, a stop-start circuit 170, and a notification circuit 172. The battery circuit 164 may be structured to monitor the operating conditions of the batteries 142 based on the battery data received from the battery sensor circuit 160. By way of example, the battery circuit 164 may be structured to determine whether the operating characteristics of the batteries 142 satisfy one or more threshold operating characteristics. For example, the battery circuit 164 may be structured to determine that the SOC of the batteries 142 is sufficient to enable restarting the engine 111 following a stop or shut-down of the engine 111. If the SOC of the batteries 142 is below an associated SOC threshold, the battery circuit 164 may provide an indication of such to the stop-start circuit 170 such that the stop-start circuit 170 transmits a command to the engine circuit 158 to disable the stop-start functionality of the engine 111 (e.g., such that an operator of the vehicle 100 does not become stranded in response to a stop-start event that fails due to insufficient power to restart the engine 111, etc.).

The confidence circuit 166 may be structured to monitor the confidence level of the battery sensors 144 based on the battery data received from the battery sensor circuit 160. By way of example, the confidence circuit 166 may be structured to determine whether the confidence level of each of the battery sensors 144 is above a threshold confidence level (e.g., high confidence; 70%, 80, 90%, etc. confidence) or a plurality of threshold confidence levels (e.g., a first threshold confidence level, a second threshold confidence level, a third threshold confidence level, etc.). If the confidence level of one or more of the battery sensors 144 is below a threshold confidence level, the confidence circuit 166 may provide an indication of such to the stop-start circuit 170. The stop-start circuit 170 may be structured to determine the cause of the low confidence of the one or more battery sensors 144 (e.g., a faulty sensor, due to a battery disconnect, a new sensor, etc.). In some embodiments, the confidence circuit 166 is structured to store the confidence level of one or more of the battery sensors 144 each time the engine 111 is started (e.g., such that the confidence level is not lost in response to a battery disconnect, etc.). The confidence circuit 166 may be further structured to compare the confidence level of the one or more of the battery sensors 144 from the current start-up of the engine to the previous start-up of the engine to determine if there was a change (e.g., an increase, a decrease, etc.). If the confidence level decreases, the confidence circuit 166 may be structured to provide an indication of such to the stop-start circuit 170. The stop-start circuit 170 may be structured to determine the cause of the reduction in the confidence level of the one or more battery sensors 144 (e.g., a faulty sensor, due to a battery disconnect, etc.).

The RTC circuit 168 may be structured to monitor the state of the RTC 180. By way of example, the RTC circuit 168 may be structured to determine whether the RTC 180 has been reset or not reset. If the RTC 180 has been reset, the RTC circuit 168 may provide an indication of such to the stop-start circuit 170. The stop-start circuit 170 may be structured to control the stop-start functionality based on the state of the RTC 180.

The stop-start circuit 170 may be structured to analyze the operating characteristics of the batteries 142 (e.g., in response to the indication provided by the battery circuit 164, etc.), the confidence level of the battery sensors 144 (e.g., in response to the indication provided by the confidence circuit 166, etc.), and/or the state of the RTC 180 (e.g., in response to the indication provided by the RTC circuit 168, etc.). The stop-start circuit 170 may be further structured to enable or disable the stop-start functionality of the engine 111 based on the operating characteristics of the batteries 142, the confidence level of the battery sensors 144, and/or the state of the RTC 180.

In some embodiments, the stop-start circuit 170 is structured to enable or disable the stop-start functionality of the engine 111 based on the state of the RTC 180 and the confidence level of the battery sensors 144. By way of example, the stop-start circuit 170 may be structured to enable the stop-start functionality of the engine 111 in response to both the state of the RTC 180 being reset (e.g., zeroed out, cleared, etc.) and the confidence level of the battery sensors 144 being less than the threshold confidence level (e.g., low confidence, etc.). According to an example embodiment, the RTC 180 being reset and the confidence level of the battery sensors 144 being at low confidence indicates that the batteries 142 were disconnected from engine 111 (e.g., the controller 150) and the battery sensors 144. The reason for the low confidence is thereby likely due to the disconnect of the batteries 142 (e.g., indicating that the battery sensors 144 are not faulty), and therefore the stop-start circuit 170 may be structured to enable the stop-start functionality of the engine 111 (e.g., which may thereby effectively increase the confidence level of the battery sensors 144 relatively quicker as compared to if the stop-start functionality was disabled in accordance with traditional stop-start control methods, etc.). By way of another example, the stop-start circuit 170 may be structured to disable the stop-start functionality of the engine 111 in response to the confidence level of one or more of the battery sensors 144 being less than the threshold confidence level and the RTC 180 not being reset. According to an example embodiment, the RTC 180 not being reset and the confidence level of at least one of the battery sensors 144 being at low confidence indicates that the at least one of the battery sensors 144 may be faulty and therefore, the stop-start functionality of the engine 111 should be disabled.

In some embodiments, the stop-start circuit 170 is structured to enable or disable the stop-start functionality of the engine 111 based on the confidence level of the battery sensors 144. By way of example, the stop-start circuit 170 may be structured to initiate an invasive stop-start sequence that automatically turns the engine 111 off and on in repetition in response to the confidence level of battery sensors 144 being less than the threshold confidence level (e.g., indicating possible battery disconnect, etc.). In other embodiments, the notification circuit 172 is additionally or alternatively structured to provide a notification to an operator of the vehicle 100 to manually perform the invasive stop-start sequence (e.g., via the operator I/O device 130, etc.). In some embodiments, the stop-start circuit 170 and/or the notification circuit 172 pauses for a predefined period of time (e.g., thirty seconds, one minute, five minutes, etc.) between restart cycles and/or providing restart notifications.

Pausing between successive stop-start events may prevent draining the SOC of the batteries 142 below a desired level by performing restarts at too high of a frequency. In some embodiments, the stop-start circuit 170 is structured to determine whether the invasive stop-start sequence is increasing the confidence level of the battery sensors 144. The stop-start circuit 170 may be structured to continue the invasive stop-start sequence until the threshold confidence level is exceeded in response to determining that the confidence level is increasing during the invasive stop-start sequence. The stop-start circuit 170 may be structured to stop the invasive stop-start sequence in response to the confidence level of at least one of the battery sensors 144 not increasing (e.g., indicating that the at least one of the battery sensors 144 may be faulty, etc.). In some embodiments, the notification circuit 172 may provide an indication (e.g., a fault notification via the operator I/O device 130, etc.) that the at least one of the battery sensors 144 is faulty.

In some embodiments, the stop-start circuit 170 is structured to enable or disable the stop-start functionality of the engine 111 based on the confidence level of the battery sensors 144. By way of example, the stop-start circuit 170 may be structured to compare the confidence level for each of the battery sensors 144 each time the engine 111 is started (e.g., stored by the confidence circuit 166, etc.) to the preceding time the engine 111 was started. Each time the confidence level updates (e.g., in response to a restart of the engine 111, etc.), the stop-start circuit 170 may be structured to determine whether the confidence level of each of the battery sensors 144 either increase, decreased, or remained constant. The stop-start circuit 170 may be structured to enable the stop-start functionality of the engine 111 in response to the confidence level of all of the battery sensors 144 decreasing (e.g., below the threshold confidence level such that all of the battery sensors 144 have a low confidence, indicating that the batteries 142 were disconnected which caused all of the battery sensors 144 to have low confidence, etc.). Conversely, the stop-start circuit 170 may be structured to disable the stop-start functionality of the engine 111 in response to (i) the confidence level of at least one of the battery sensors 144 being greater than the threshold confidence level and (ii) the confidence level of at least one of the battery sensors 144 decreasing such that the confidence level is less than the threshold confidence level (e.g., if all of the battery sensors 144 had a confidence level greater than the threshold confidence level prior to the engine restart, indicating that at least one of the battery sensors 144 may be faulty, etc.). In such a case, the notification circuit 172 may be structured to provide a fault notification to an operator of the vehicle 100 (e.g., via the operator I/O device 130, etc.) regarding the at least one faulty battery sensor 144.

In some embodiments, the stop-start circuit 170 is structured to enable the stop-start functionality of the engine 111 in a tiered approach that progressively increases the rate or frequency of stop-start events as the confidence of the battery sensors 144 increases. By way of example, the battery sensors 144 may have a first confidence level that is less than a first threshold confidence level (e.g., 70% confidence, etc.). The stop-start circuit 170 may be structured to disable the stop-start functionality of the engine 111 while the first confidence level of the battery sensors 144 is less than the first threshold confidence level. After one or more manual restarts of the engine 111 (e.g., according to normal operation of the engine 111, etc.), the first confidence level of the battery sensors 144 may increase to a second confidence level that is greater than the first threshold confidence level, but less than a second threshold confidence level (e.g., 80%, etc.). The stop-start circuit 170 may be structured to enable the stop-start functionality of the engine 111 and limit the stop-start functionality of the engine 111 to a first stop-start rate (e.g., 30 stops-per-hour, etc.) in response to the confidence level of the battery sensors 144 being greater than the first threshold confidence level.

Further, after one or more additional manual and/or automatic restarts of the engine 111, the second confidence level of the battery sensors 144 may increase to a third confidence level that is greater than the second threshold confidence level, but less than a third threshold confidence level (e.g., 90%, etc.). The stop-start circuit 170 may be structured to limit the stop-start functionality of the engine 111 to a second, higher stop-start rate (e.g., 50 stops-per-hour, etc.) in response to the confidence level of the battery sensors 144 being greater than the second threshold confidence level. Again, after one or more additional manual and/or automatic restarts of the engine 111, the third confidence level of the battery sensors 144 may increase to a fourth confidence level that is greater than the third threshold confidence level. The stop-start circuit 170 may be structured to remove any limits on the stop-start functionality of the engine 111 in response to the confidence level of the battery sensors 144 being greater than the third threshold confidence level. It should be noted that the above threshold were used for example purposes only. In other embodiments, the stop-start rates may vary for the various thresholds and/or other thresholds may be used (e.g., different values for each threshold, a different number of thresholds, etc.).

Figure 3:
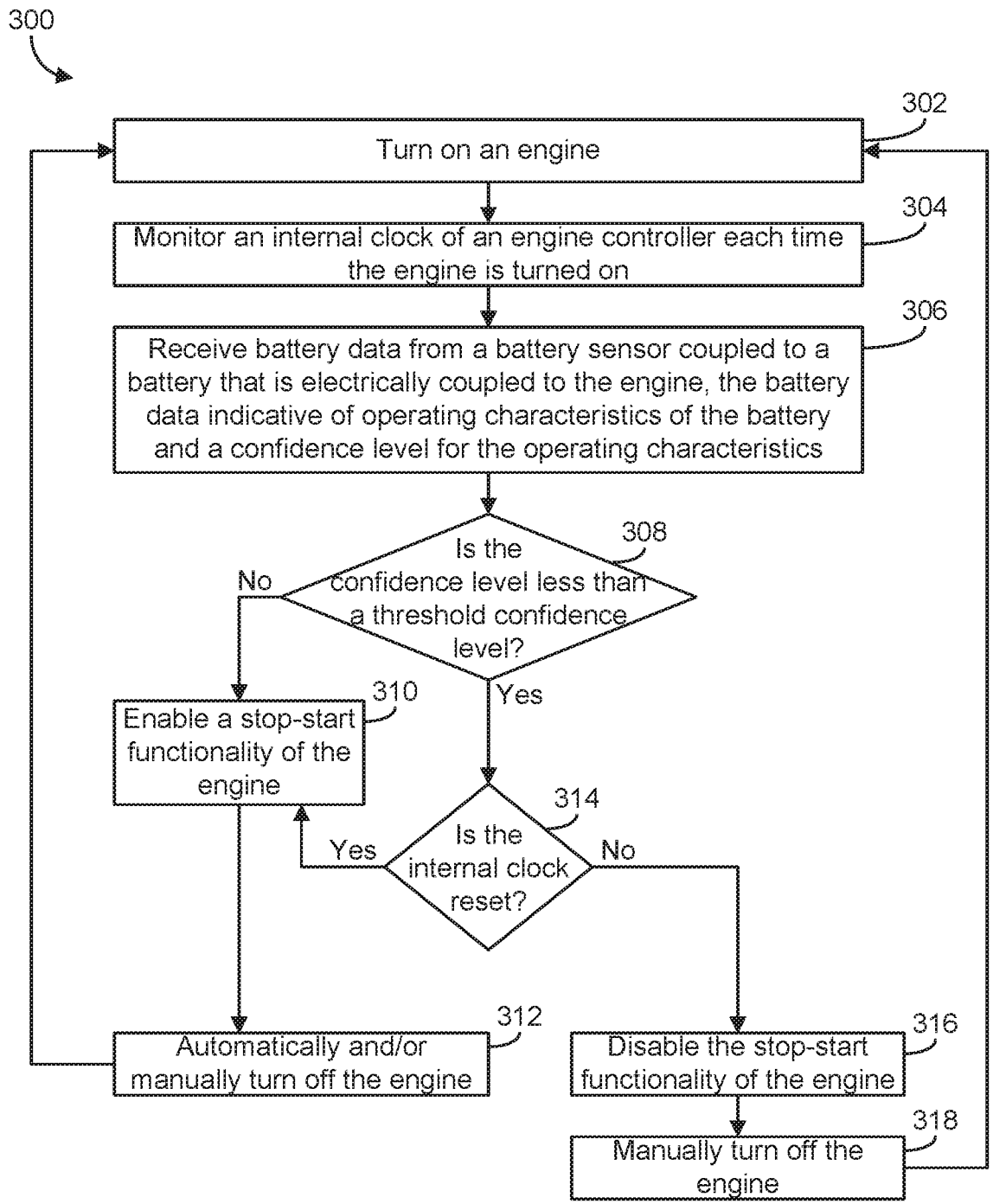
FIG. 3 is a flow diagram of a method for accommodating loss of battery charge history in a stop-start system, according to an example embodiment.

Referring now to FIG. 3, a method 300 for accommodating loss of battery charge history in a stop-start system is shown according to an example embodiment. In one example embodiment, method 300 may be implemented with the vehicle 100 and the controller 150 of FIGS. 1-2. As such, method 300 may be described with regard to FIGS. 1-2.

At step 302, an engine (e.g., the engine 111, of the vehicle 100, etc.) is turned on (e.g., started, manually by an operator, by the controller 150, etc.). At step 304, a controller (e.g., the controller 150, etc.) is structured to monitor an internal clock (e.g., the RTC 180, etc.) thereof (e.g., each time the engine 111 is turned on, etc.). At step 306, the controller is structured to receive battery data from a battery sensor (e.g., the battery sensor(s) 144, etc.). According to an example embodiment, the battery sensor is coupled to a battery (e.g., one of the batteries 142, etc.) that is electrically coupled to the engine such that the battery sensor is positioned to acquire the battery data from the battery. The battery data may be indicative of operating characteristics of the battery (e.g., SOC, SOH, SOF, current flow, voltage, etc.) and include a confidence level associated with the operating characteristics. The confidence level may indicate an estimated accuracy or reliability of the battery data. According to an example embodiment, the battery sensor includes volatile memory such that disconnecting the battery sensor from the battery (e.g., for maintenance purposes, during a servicing event, etc.) will effectively erase (e.g., clear, delete, etc.) any memory (e.g., information, data, etc.) regarding the battery data and the confidence level. Disconnecting the battery sensor from the battery may thereby erase the volatile memory of the battery sensor causing the confidence level to drop below (e.g., decrease, reset, etc.) a threshold confidence level. According to an example embodiment, disconnecting the battery from the engine causes the internal clock of the controller to reset (e.g., clear, return to zero, etc.).

At step 308, the controller is structured to determine whether the confidence level of the battery sensor is less than the threshold confidence level. At step 310, the controller is structured to enable a stop-start functionality of the engine in response to the confidence level of the battery sensor being greater than the threshold confidence level (e.g., indicating that the battery sensor may be neither faulty nor that the battery sensor was disconnected from the battery, etc.). At step 312, the engine is at least one of automatically turned off (e.g., by the controller according to the stop-start functionality when the vehicle 100 comes to a stop, etc.) and manually turned off (e.g., by an operator of the vehicle 100 manually turning a key or pressing an off/stop button, etc.). The controller may then return to step 302 and await the engine to be turned on automatically (e.g., by the controller according to the stop-start functionality of the engine in response to an operator pressing an accelerator pedal, etc.) or turned on manually (e.g., by an operator of the vehicle 100 manually turning a key or pressing an on/start button, etc.) and repeat steps 302-312 until the confidence level of the battery sensor drops below the threshold confidence level (e.g., in response to the battery sensor being disconnected from the battery, etc.).

At step 314, the controller is structured to determine whether the internal clock has been reset (e.g., in response to the battery being disconnected from the engine, etc.) in response to the confidence level of the battery sensor being less than the threshold confidence level. The controller is structured to proceed to step 310 in response to the confidence level being less than the threshold confidence level and the internal clock being reset thereby indicating that the battery was disconnected from both the battery sensor and the engine. According to an example embodiment, enabling the stop-start functionality of the engine increases the confidence level of a non-faulty battery sensor (e.g., each time the engine is restarted the battery sensor receives ample amounts of data to quickly increase the confidence level, etc.).

At step 316, the controller is structured to disable the stop-start functionality of the engine in response to the confidence level being less than the threshold confidence level and the internal clock not being reset. The controller may be structure to disable the stop-start functionality if the internal clock (i) has never been reset before, (ii) has not been reset for more than a predetermined period of time, and/or (iii) has not been reset for more than a minimum number of restarts such that the stop-start functionally is not disabled soon after the reset condition was met (i.e., preventing the stop-start functionality from being disabled after it was enabled in response to the internal clock being reset for a period of time to allow the confidence level of the battery sensor to increase). The confidence level being less than the threshold confidence level and the internal clock not being reset may provide an indication that the battery sensor truly has a low confidence (e.g., may be faulty, may be a new sensor, etc.) and the stop-start functionality should be disabled. At step 318, the engine is manually turned off (e.g., by an operator of the vehicle 100 manually turning a key or pressing an off/stop button, etc.) and the controller waits for the engine to be manually turned back on (step 302) to restart methods 300.

Figure 4:
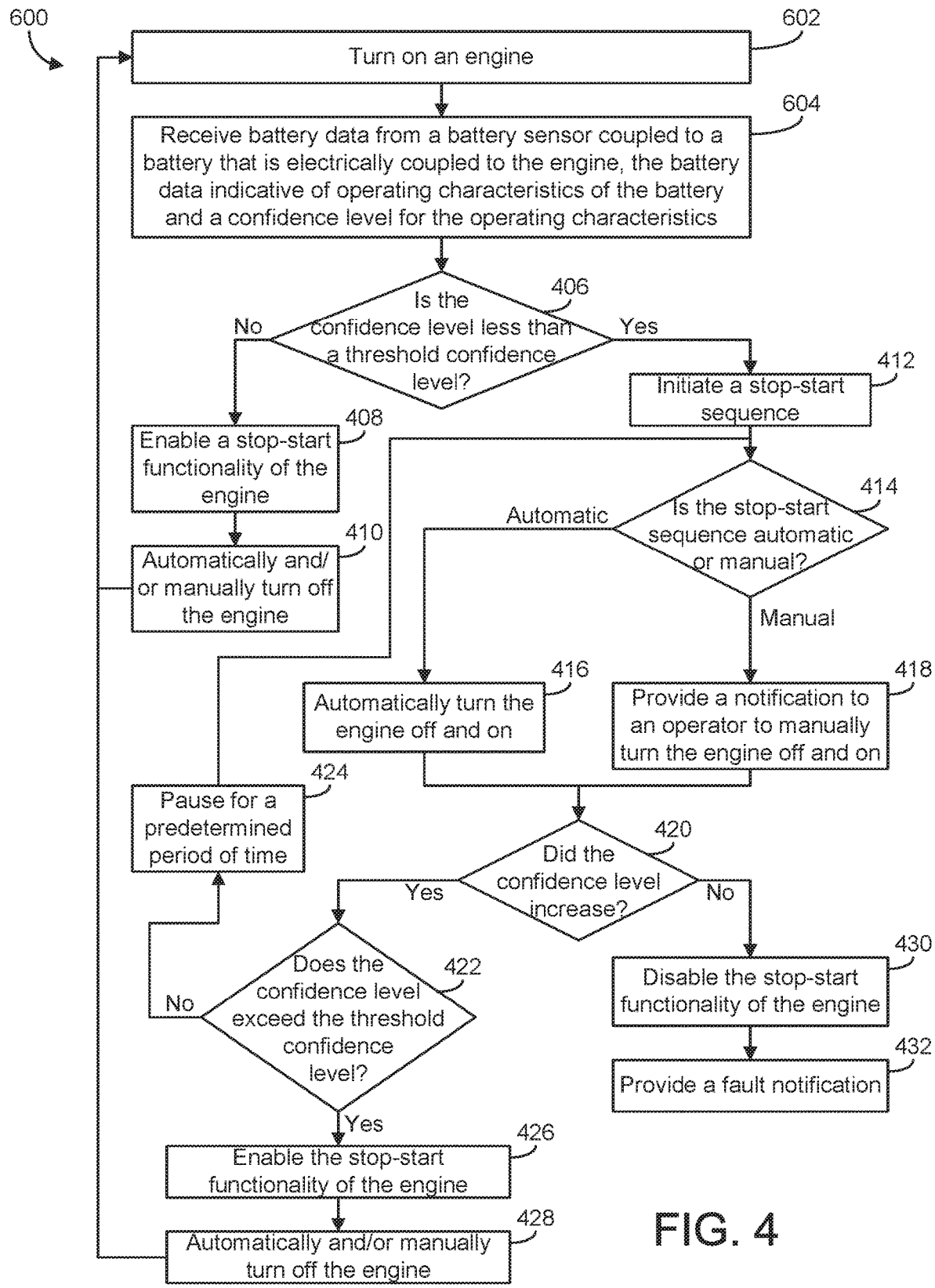
FIG. 4 is a flow diagram of a method for accommodating loss of battery charge history in a stop-start system, according to another example embodiment.

Referring now to FIG. 4, a method 400 for accommodating loss of battery charge history in a stop-start system is shown according to an example embodiment. In one example embodiment, method 400 may be implemented with the vehicle 100 and the controller 150 of FIGS. 1-2. As such, method 400 may be described with regard to FIGS. 1-2.

At step 402, an engine (e.g., the engine 111, of the vehicle 100, etc.) is turned on (e.g., started, manually by an operator, by the controller 150, etc.). At step 404, a controller (e.g., the controller 150, etc.) is structured to receive battery data from a battery sensor (e.g., the battery sensor(s) 144, etc.). According to an example embodiment, the battery sensor is coupled to a battery (e.g., one of the batteries 142, etc.) that is electrically coupled to the engine such that the battery sensor is positioned to acquire the battery data from the battery. The battery data may be indicative of operating characteristics of the battery (e.g., SOC, SOH, SOF, current flow, voltage, etc.) and include a confidence level associated with the operating characteristics. The confidence level may indicate an estimated accuracy or reliability of the battery data. According to an example embodiment, the battery sensor includes volatile memory such that disconnecting the battery sensor from the battery (e.g., for maintenance purposes, etc.) will effectively erase (e.g., clear, delete, etc.) any memory (e.g., information, data, etc.) regarding the battery data and the confidence level. Disconnecting the battery sensor from the battery may thereby erase the volatile memory of the battery sensor causing the confidence level to drop below (e.g., decrease, reset, etc.) a threshold confidence level.

At step 406, the controller is structured to determine whether the confidence level of the battery sensor is less than the threshold confidence level (e.g., low confidence, etc.). At step 408, the controller is structured to enable a stop-start functionality of the engine in response to the confidence level of the battery sensor being greater than the threshold confidence level (e.g., indicating that the battery sensor may be neither faulty nor that the battery sensor was disconnected from the battery, etc.). At step 410, the engine is at least one of automatically turned off (e.g., by the controller according to the stop-start functionality when the vehicle 100 comes to a stop, etc.) and manually turned off (e.g., by an operator of the vehicle 100 manually turning a key or pressing an off/stop button, etc.). The controller may then return to step 402 and await the engine to be turned on automatically (e.g., by the controller according to the stop-start functionality of the engine in response to an operator pressing an accelerator pedal, etc.) or turned on manually (e.g., by an operator of the vehicle 100 manually turning a key or pressing an on/start button, etc.) and repeat steps 402-410 until the confidence level of the battery sensor drops below the threshold confidence level (e.g., in response to the battery sensor being disconnected from the battery, etc.).

At step 412, the controller is structured to initiate a stop-start sequence in response to the confidence level of the battery sensor being less than the threshold confidence level (e.g., indicating that the battery sensor has been disconnected from the battery, the battery sensor is faulty, etc.). At step 414, the controller is structured to determine whether the stop-start sequence is an automatic sequence or a manual sequence (e.g., based on the engine system in use, based on operator preference, predefined within the controller, etc.). At step 416, the controller is structured to automatically turn the engine off and back on in response to determining that the stop-start sequence is an automatic sequence. At step 418, the controller is structured to provide a notification to an operator of the engine (e.g., via the operator I/O device 130, etc.) to manually turn the engine off and on in response to determining that the stop-start sequence is a manual sequence. According to an example embodiment, restarting the engine increases the confidence level of a non-faulty battery sensor (e.g., each time the engine is restarted the battery sensor receives ample amounts of data to quickly increase the confidence level, etc.).

At step 420, the controller is structured to determine whether the confidence level of the battery sensor increased in response to the automatic or manual restart (e.g., indicating that the sensor may be operational and not faulty, indicating that the low confidence may be a result of disconnecting the battery sensor from the battery for maintenance, etc.). At step 422, the controller is structured to determine whether the confidence level of the battery sensor exceeds the threshold confidence level. At step 424, the controller is structured to pause for a predefined period of time (e.g., thirty seconds, one minute, five minutes, etc.) in response to the confidence level of the battery sensor not exceeding the threshold confidence level before repeating steps 416-422. According to an example embodiment, pausing between restart cycles may prevent draining the battery charge below a desired level by performing restarts at too high of a frequency.

At step 426, the controller is structured to enable the stop-start functionality of the engine in response to the confidence level of the battery sensor exceeding the threshold confidence level (e.g., due to the invasive/forceful stop-start sequence, etc.). At step 428, the engine is at least one of automatically turned off (e.g., by the controller according to the stop-start functionality when the vehicle 100 comes to a stop, etc.) and manually turned off (e.g., by an operator of the vehicle 100 manually turning a key or pressing an off/stop button, etc.). The controller may then return to step 402 and await the engine to be turned on automatically (e.g., by the controller according to the stop-start functionality of the engine in response to an operator pressing an accelerator pedal, etc.) or turned on manually (e.g., by an operator of the vehicle 100 manually turning a key or pressing an on/start button, etc.) and repeat method 400.

At step 430, the controller is structured to disable the stop-start functionality of the engine in response to the confidence level of the battery sensor remaining the same or decreasing (e.g., indicating that the battery sensor may be faulty, etc.). At step 432, the controller is structured to provide a fault notification to an operator via an output device (e.g., the operator I/O device 130, etc.) that at least one of the stop-start functionality has been disabled and that the battery sensor may be faulty.

Figure 5:
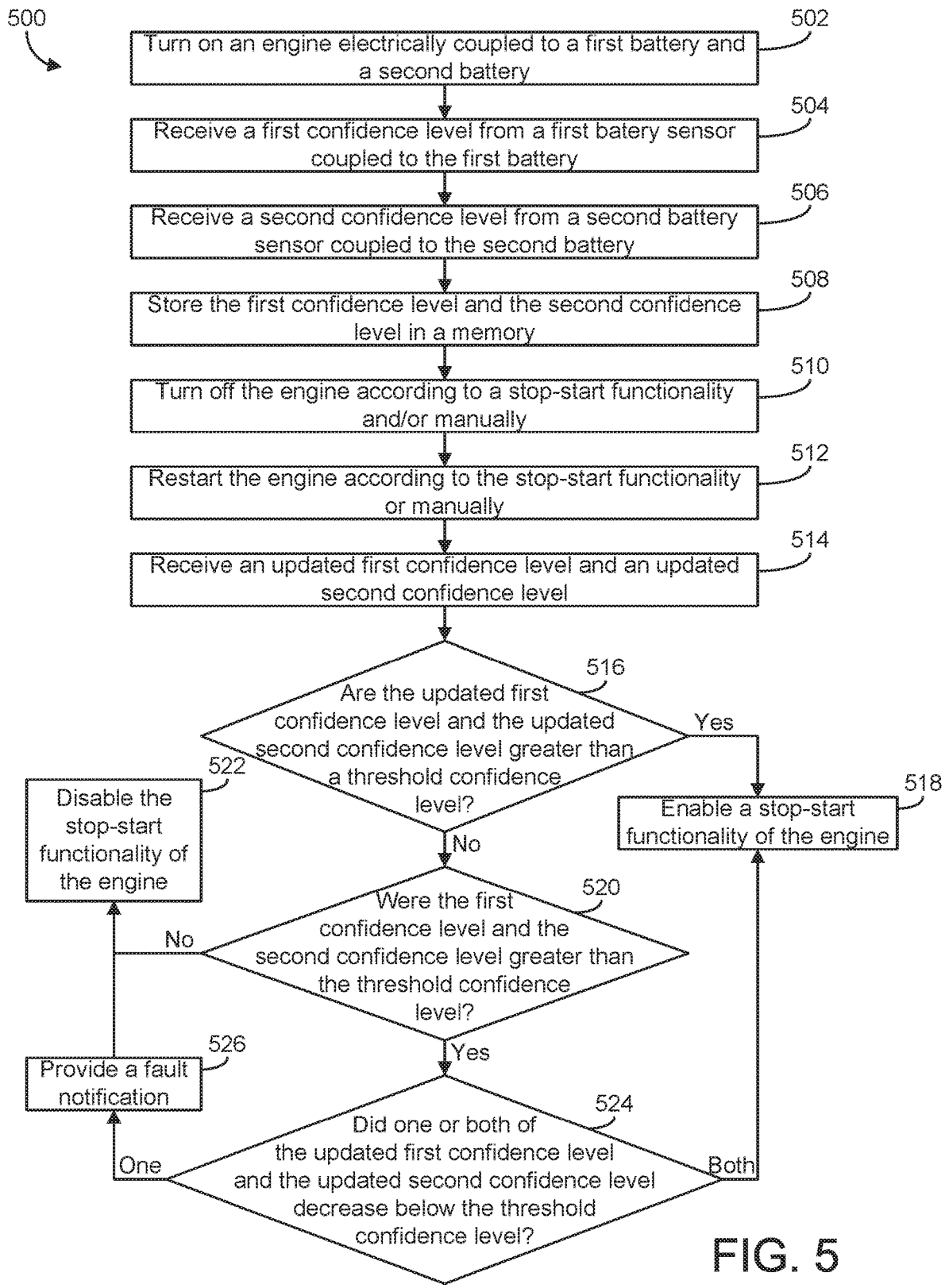
FIG. 5 is a flow diagram of a method for accommodating loss of battery charge history in a stop-start system, according to another example embodiment.

Referring now to FIG. 5, a method 500 for accommodating loss of battery charge history in a stop-start system is shown according to an example embodiment. In one example embodiment, method 500 may be implemented with the vehicle 100 and the controller 150 of FIGS. 1-2. As such, method 500 may be described with regard to FIGS. 1-2.

At step 502, an engine (e.g., the engine 111, of the vehicle 100, etc.) is turned on (e.g., started, manually by an operator, by the controller 150, etc.). According to an example embodiment, the engine is electrically coupled to a first battery (e.g., a first battery 142, etc.) and a second battery (e.g., a second battery 142, etc.). In other embodiments, the engine is electrically coupled to one battery or three or more batteries (e.g., three, four, five, etc.). At step 504, a controller (e.g., the controller 150, etc.) is structured to receive first battery data from a first battery sensor (e.g., a first battery sensor 144, etc.). According to an example embodiment, the first battery sensor is coupled to the first battery such that the first battery sensor is positioned to acquire the first battery data from the first battery. The first battery data may be indicative of first operating characteristics of the first battery (e.g., SOC, SOH, SOF, current flow, voltage, etc.) and include a first confidence level associated with the first operating characteristics. The first confidence level may indicate an estimated accuracy or reliability of the first battery data. At step 506, the controller is structured to receive second battery data from a second battery sensor (e.g., a second battery sensor 144, etc.). According to an example embodiment, the second battery sensor is coupled to the second battery such that the second battery sensor is positioned to acquire the second battery data from the second battery. The second battery data may be indicative of second operating characteristics of the second battery (e.g., SOC, SOH, SOF, current flow, voltage, etc.) and include a second confidence level associated with the second operating characteristics. The second confidence level may indicate an estimated accuracy or reliability of the second battery data.

According to an example embodiment, the first battery sensor and the second battery sensor include volatile memory such that disconnecting at least one of the first battery sensor and the second battery sensor from the first battery and the second battery, respectively, will effectively erase (e.g., clear, delete, etc.) any memory (e.g., information, data, etc.) regarding the first battery data, the second battery data, the first confidence level, and/or the second confidence level. Disconnecting the first battery sensor from the first battery may thereby erase the volatile memory of the first battery sensor causing the first confidence level to drop below (e.g., decrease, reset, etc.) a threshold confidence level. Disconnecting the second battery sensor from the second battery may thereby erase the volatile memory of the second battery sensor causing the second confidence level to drop below (e.g., decrease, reset, etc.) the threshold confidence level.

At step 508, the controller is structured to store the first confidence level of the first battery sensor and the second confidence level of the second battery sensor in a memory thereof (e.g., the memory 154, the confidence circuit 166, etc.). According to an example embodiment, the memory of the controller includes a non-volatile memory (e.g., the memory does not erase when power is removed from controller, etc.). In some embodiments, the controller is structured to store the first confidence level and the second confidence level at start-up of the engine. In some embodiments, the controller is structured to store the first confidence level and the second confidence level at shut-down of the engine. Therefore, the first confidence level and the second confidence level may be stored prior to the engine being shut down.

At step 510, the engine is at least one of automatically turned off (e.g., by the controller according to the stop-start functionality when the vehicle 100 comes to a stop, etc.) and manually turned off (e.g., by an operator of the vehicle 100 manually turning a key or pressing an off/stop button, etc.). At step 512, the engine is restarted (e.g., turned on, etc.) automatically (e.g., by the controller according to the stop-start functionality of the engine in response to an operator pressing an accelerator pedal, etc.) or turned on manually (e.g., by an operator of the vehicle 100 manually turning a key or pressing an on/start button, etc.). At step 514, the controller is structured to receive an updated first confidence level from the first battery sensor and an updated second confidence level from the second battery sensor at restart of the engine. At step 516, the controller is structured to determine whether the updated first confidence level and the updated second confidence level are greater than the threshold confidence level. At step 518, the controller is structured to enable a stop-start functionality of the engine in response to the updated first confidence level and the updated second confidence level being greater than the threshold confidence level (e.g., the first battery sensor and the second battery sensor are functioning and have a high confidence level, etc.).

At step 520, the controller is structured to determine whether the first confidence level and the second confidence level were greater than the threshold confidence level prior to restart in response to the updated first confidence level and the updated second confidence level being less than the threshold confidence level. At step 522, the controller is structure to disable the stop-start functionality of the engine in response to the first confidence level and the second confidence level being less than the threshold confidence level.

At step 524, the controller is structured to determine whether one or both of the updated first confidence level and the updated second confidence level decreased below the threshold confidence level after the engine was restarted. The controller is structured to enable the stop-start functionality of the engine (step 518) in response to both the first confidence level and the second confidence level decreasing below the threshold confidence level after the engine is restarted. According to an example embodiment, the first confidence level and the second confidence level decreasing below the threshold confidence level after the engine is restarted provides an indication that the first battery sensor and the second battery were disconnected from the first battery and the second battery, respectively. At step 526, the controller is structured to provide a fault notification to an operator via an output device (e.g., the operator I/O device 130, etc.) that at least one of the stop-start functionality has been disabled (step 522) and that the first battery sensor or the second battery sensor may be faulty in response to (i) the first confidence level decreasing below the threshold confidence level after the engine was restarted and (ii) the second confidence remaining above the threshold confidence level after the engine was restarted, or vice versa.

Figure 6:
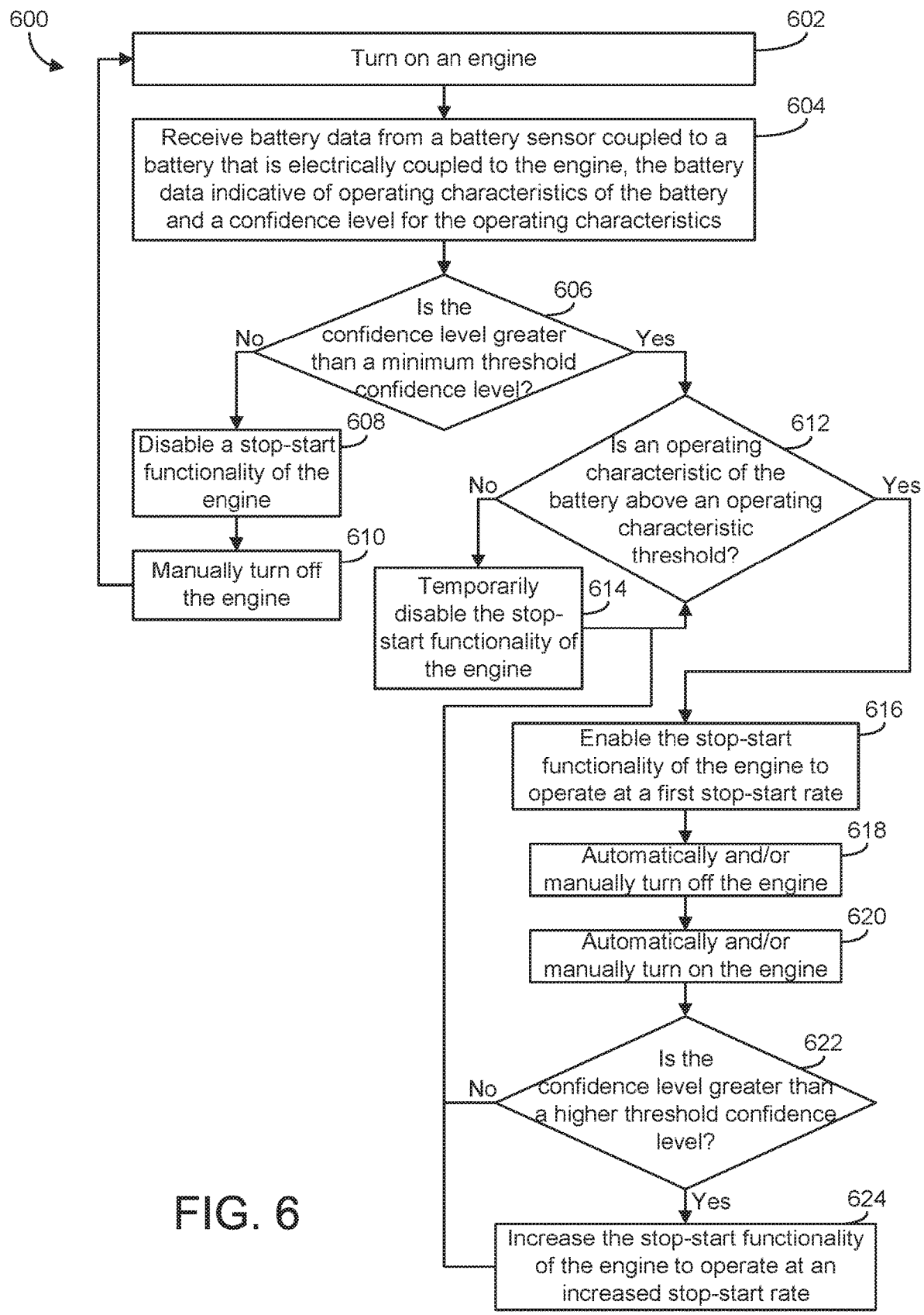
FIG. 6 is a flow diagram of a method for accommodating loss of battery charge history in a stop-start system, according to another example embodiment.

Referring now to FIG. 6, a method 600 for accommodating loss of battery charge history in a stop-start system is shown according to an example embodiment. In one example embodiment, method 600 may be implemented with the vehicle 100 and the controller 150 of FIGS. 1-2. As such, method 600 may be described with regard to FIGS. 1-2.

At step 602, an engine (e.g., the engine 111, of the vehicle 100, etc.) is turned on (e.g., started, manually by an operator, by the controller 150, etc.). At step 604, a controller (e.g., the controller 150, etc.) is structured to receive battery data from a battery sensor (e.g., the battery sensor(s) 144, etc.). According to an example embodiment, the battery sensor is coupled to a battery (e.g., one of the batteries 142, etc.) that is electrically coupled to the engine such that the battery sensor is positioned to acquire the battery data from the battery. The battery data may be indicative of operating characteristics of the battery (e.g., SOC, SOH, SOF, current flow, voltage, etc.) and include a confidence level associated with the operating characteristics. The confidence level may indicate an estimated accuracy or reliability of the battery data. According to an example embodiment, the battery sensor includes volatile memory such that disconnecting the battery sensor from the battery (e.g., for maintenance purposes, etc.) will effectively erase (e.g., clear, delete, etc.) any memory (e.g., information, data, etc.) regarding the battery data and the confidence level. Disconnecting the battery sensor from the battery may thereby erase the volatile memory of the battery sensor causing the confidence level to drop below (e.g., decrease, reset, etc.) a threshold confidence level.

At step 606, the controller is structured to determine whether the confidence level of the battery sensor is greater than a minimum threshold confidence level (e.g., a first threshold confidence level; 50%, 60%, 70%, etc. confidence). At step 608, the controller is structured to disable a stop-start functionality of the engine in response to the confidence level of the battery sensor being less than the minimum threshold confidence level (e.g., indicating that the battery sensor is providing the battery data at a low confidence, etc.). At step 610, the engine is manually turned off (e.g., by an operator of the vehicle 100 manually turning a key or pressing an off/stop button, etc.). The controller may then return to step 602 and await the engine to be turned on manually (e.g., by an operator of the vehicle 100 manually turning a key or pressing an on/start button, etc.) and repeat steps 602-610 until the confidence level of the battery sensor exceeds the minimum threshold confidence level.

At step 612, the controller is structured to determine whether an operating characteristic of the battery is above an operating characteristics threshold (e.g., the SOC of the battery is above a SOC threshold such that the battery has sufficient charge to restart the engine, etc.) in response to the confidence level of the battery sensor being greater than the threshold confidence level. At step 614, the controller is structured to temporarily disable the stop-start functionality of the engine until the operating characteristic of the engine exceeds the operating characteristics threshold (e.g., repeats step 612 and step 614, etc.).

At step 616, the controller is structured to enable the stop-start functionality of the engine to operate at a first stop-start rate (e.g., 10, 20, 30, etc. stops per hour) in response to the confidence level of the battery sensor being greater than the minimum threshold confidence level and the operating characteristic of the battery being greater that the operating characteristics threshold. At step 618, the engine is at least one of automatically turned off (e.g., by the controller according to the stop-start functionality when the vehicle 100 comes to a stop, etc.) and manually turned off (e.g., by an operator of the vehicle 100 manually turning a key or pressing an off/stop button, etc.). At step 620, the engine is at least one of turned on automatically (e.g., by the controller according to the stop-start functionality of the engine in response to an operator pressing an accelerator pedal, etc.) or turned on manually (e.g., by an operator of the vehicle 100 manually turning a key or pressing an on/start button, etc.).

At step 622, the controller is structured to determine whether the confidence level of the battery sensor is greater than a higher, second threshold confidence level (e.g., 60%, 70%, 80%, etc. confidence). The controller is structured to repeat step 612-622 in response to the confidence level of the battery sensor being less than the second, higher threshold confidence level. At step 624, the controller is structured to increase the stop-start functionality of the engine to operate at an increased stop-start rate (e.g., a second stop-start rate; 20, 30, 40, etc. stops per hour) in response to the confidence level of the battery sensor being greater that the second, higher threshold confidence level. The controller is structured to repeat steps 612-624, incrementally increasing the stop-start rate of the engine each time the confidence level of the battery sensor exceeds a higher threshold confidence level (e.g., 70%, 80%, 90%, etc. confidence) until the confidence level exceeds a maximum threshold confidence level (e.g., 90% confidence, etc.). According to an example embodiment, the stop-start rate is substantially unrestricted when the confidence level of the battery sensor exceeds the maximum threshold confidence level.

It should be understood that no claim element herein is to be construed under the provisions of 35 U.S.C. § 112(f), unless the element is expressly recited using the phrase "means for." The schematic flow chart diagrams and method schematic diagrams described above are generally set forth as logical flow chart diagrams. As such, the depicted order and labeled steps are indicative of representative embodiments. Other steps, orderings and methods may be conceived that are equivalent in function, logic, or effect to one or more steps, or portions thereof, of the methods illustrated in the schematic diagrams. Further, reference throughout this specification to "one embodiment", "an embodiment", "an example embodiment", or similar language means that a particular feature, structure, or characteristic described in connection with the embodiment is included in at least one embodiment of the present invention. Thus, appearances of the phrases "in one embodiment", "in an embodiment", "in an example embodiment", and similar language throughout this specification may, but do not necessarily, all refer to the same embodiment.

Additionally, the format and symbols employed are provided to explain the logical steps of the schematic diagrams and are understood not to limit the scope of the methods illustrated by the diagrams. Although various arrow types and line types may be employed in the schematic diagrams, they are understood not to limit the scope of the corresponding methods. Indeed, some arrows or other connectors may be used to indicate only the logical flow of a method. For instance, an arrow may indicate a waiting or monitoring period of unspecified duration between enumerated steps of a depicted method. Additionally, the order in which a particular method occurs may or may not strictly adhere to the order of the corresponding steps shown. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

Many of the functional units described in this specification have been labeled as circuits, in order to more particularly emphasize their implementation independence. For example, a circuit may be implemented as a hardware circuit comprising custom very-large-scale integration (VLSI) circuits or gate arrays, off-the-shelf semiconductors such as logic chips, transistors, or other discrete components. A circuit may also be implemented in programmable hardware devices such as field programmable gate arrays, programmable array logic, programmable logic devices or the like.

As mentioned above, circuits may also be implemented in machine-readable medium for execution by various types of processors, such as processor 152 of FIG. 2. An identified circuit of executable code may, for instance, comprise one or more physical or logical blocks of computer instructions, which may, for instance, be organized as an object, procedure, or function. Nevertheless, the executables of an identified circuit need not be physically located together, but may comprise disparate instructions stored in different locations which, when joined logically together, comprise the circuit and achieve the stated purpose for the circuit. Indeed, a circuit of computer readable program code may be a single instruction, or many instructions, and may even be distributed over several different code segments, among different programs, and across several memory devices. Similarly, operational data may be identified and illustrated herein within circuits, and may be embodied in any suitable form and organized within any suitable type of data structure. The operational data may be collected as a single data set, or may be distributed over different locations including over different storage devices, and may exist, at least partially, merely as electronic signals on a system or network.

The computer readable medium (also referred to herein as machine-readable media or machine-readable content) may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing. As alluded to above, examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. As also alluded to above, computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer (such as via the controller 150 of FIGS. 1 and 2), partly on the user's computer, as a stand-alone computer-readable package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

Accordingly, the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method, comprising:
   receiving, by a processing circuit, a first confidence level from a first battery sensor coupled to a first battery electrically coupled to an engine system;
   receiving, by the processing circuit, a second confidence level from a second battery sensor coupled to a second battery electrically coupled to the engine system;
   storing, by the processing circuit in a memory, the first confidence level and the second confidence level prior to the engine system being powered off;
   receiving, by the processing circuit, an updated first confidence level from the first battery sensor and an updated second confidence level from the second battery sensor after the engine system is powered on;
   comparing, by the processing circuit, (i) the first confidence level to the updated first confidence level for the first battery sensor and (ii) the second confidence level to the updated second confidence level for the second battery sensor; and
   enabling, by the processing circuit, a stop-start functionality of the engine system in response to the first confidence level and the second confidence level decreasing after the engine system is powered on relative to when the engine system was powered off.

2. The method of claim 1, wherein the memory is a non-volatile memory.

3. The method of claim 1, wherein the first battery sensor and the second battery sensor have volatile memory such that disconnecting at least one of the first battery sensor and the second battery sensor from the first battery and the second battery, respectively, erases data stored in the volatile memory such that at least one of the first confidence level and the second confidence level decreases below a threshold confidence level, respectively.

4. The method of claim 1, wherein the first confidence level and the second confidence level decreasing after the engine system is powered on relative to when the engine system was powered off provides an indication that the first battery sensor and the second battery sensor were disconnected from the first battery and the second battery, respectively.

5. The method of claim 1, further comprising disabling, by the processing circuit, the stop-start functionality in response to (i) the first confidence level decreasing after the engine system is powered on relative to when the engine system was powered off and (ii) the second confidence level increasing or remaining constant after the engine system is powered on relative to when the engine system was powered off.

6. The method of claim 1, further comprising enabling, by the processing circuit, the stop-start functionality in response to the first confidence level and the second confidence level increasing or remaining constant after the engine system is powered on relative to when the engine system was powered off.

7. The method of claim 1, wherein the first battery sensor and the second battery sensor are structured to acquire battery data indicative of operating characteristics of the first battery and the second battery, respectively, and wherein the first confidence level and the second confidence level indicate an estimated accuracy of the battery data.

8. The method of claim 7, wherein the operating characteristics include at least one of a state of charge, a state of function, and a state of health of the first battery and the second battery.

9. A method, comprising:
   monitoring, by a processing circuit, an internal clock of the processing circuit each time an engine is started;
   receiving, by the processing circuit from a battery sensor coupled to a battery, battery data indicative of operating characteristics of the battery and a confidence level for the operating characteristics; and
   enabling, by the processing circuit, a stop-start functionality of the engine in response to detecting the internal clock being reset and the confidence level being less than a threshold confidence level.

10. The method of claim 9, wherein the battery sensor includes volatile memory.

11. The method of claim 10, wherein disconnecting the battery sensor from the battery erases the battery data and the confidence level stored in the volatile memory.

12. The method of claim 10, wherein disconnecting the battery sensor from the battery erases the volatile memory of the battery sensor thereby causing the confidence level to drop below the threshold confidence level, and wherein disconnecting the battery from the engine causes the internal clock of the processing circuit to reset.

13. The method of claim 9, further comprising disabling, by the processing circuit, the stop-start functionality of the engine in response to detecting the internal clock not being reset and the confidence level being less than the threshold confidence level.

14. The method of claim 9, further comprising determining, by the battery sensor, the operating characteristics of the battery based on an output current and an input current of the battery.

15. The method of claim 9, wherein operating the engine according to the stop-start functionality increases the confidence level of the battery sensor.

16. A method, comprising:
   receiving, by a processing circuit from a battery sensor coupled to a battery of an engine, battery data indicative of operating characteristics of the battery and a confidence level for the operating characteristics;
   comparing, by the processing circuit, the confidence level to a threshold confidence level; and
   at least one of (i) performing, by the processing circuit, a stop-start sequence that turns the engine on and off until the confidence level of the battery sensor exceeds the threshold confidence level and (ii) providing, by the processing circuit via a user interface, a notification to an operator of the engine to manually perform the stop-start sequence by manually turning the engine on and off until the confidence level of the battery sensor exceeds the threshold confidence level in response to the confidence level being less than the threshold confidence level.

17. The method of claim 16, wherein each stop-start of the stop-start sequence increases the confidence level of a non-faulty battery sensor.

18. The method of claim 16, wherein the battery sensor includes volatile memory such that disconnecting the battery sensor from the battery erases the battery data and the confidence level stored in the volatile memory.

19. The method of claim 16, further comprising pausing for a predefined time between each successive stop-start of the stop-start sequence.

20. The method of claim 16, further comprising enabling, by the processing circuit, a stop-start functionality of the engine in response to the confidence level exceeding the threshold confidence level.

\* \* \* \* \*